(12) United States Patent
Sato et al.

(10) Patent No.: US 8,338,312 B2
(45) Date of Patent: Dec. 25, 2012

(54) FILM FORMATION METHOD, FILM FORMATION APPARATUS, AND METHOD FOR USING FILM FORMATION APPARATUS

(75) Inventors: Jun Sato, Nirasaki (JP); Eiji Kikama, Nirasaki (JP); Masataka Toiya, Oshu (JP); Tetsuya Shibata, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/024,607

(22) Filed: Feb. 10, 2011

(65) Prior Publication Data

US 2011/0201210 A1  Aug. 18, 2011

(30) Foreign Application Priority Data

Feb. 15, 2010 (JP) ................. 2010-030634
Jan. 20, 2011 (JP) ................. 2011-009704

(51) Int. Cl.
*H01L 21/31* (2006.01)
(52) U.S. Cl. ........................... 438/770; 134/4
(58) Field of Classification Search ............ 438/787, 438/788, 789, 770; 134/4
See application file for complete search history.

(56) References Cited

U.S. PATENT DOCUMENTS

| 7,923,378 B2 * | 4/2011 | Hasebe et al. ............... 438/763 |
| 2005/0130427 A1 * | 6/2005 | Won et al. .................... 438/689 |
| 2006/0199384 A1 * | 9/2006 | Ando et al. ................... 438/680 |

FOREIGN PATENT DOCUMENTS

| JP | 2003-7700 | 1/2003 |
| JP | 2006-351948 | 12/2006 |
| JP | 2008-140864 | 6/2008 |

* cited by examiner

*Primary Examiner* — Charles Garber
*Assistant Examiner* — Reema Patel
(74) *Attorney, Agent, or Firm* — Oblon, Spivak, McClelland, Maier & Neustadt, L.L.P.

(57) ABSTRACT

A film formation method includes a film formation process for forming an $SiO_2$ film on a surface of a target object inside a process container by use of an Si source gas and an oxidizing agent, and an oxidation purge process for performing oxidation on films deposited inside the process container while exhausting gas from inside the process container after unloading the target object from the process container, wherein the film formation process and the oxidation purge process are alternately repeated a plurality of times without, interposed therebetween, a process for removing the films deposited inside the process container.

18 Claims, 16 Drawing Sheets

FIG. 10A

| SiO₂ deposition (about 30nm) | Cyclic purge | SiO₂ deposition (about 30nm) | Cyclic purge | SiO₂ deposition (about 30nm) | Cyclic purge | SiO₂ deposition (about 30nm) | Cyclic purge |

FIG. 10B

| SiO₂ deposition (about 30nm) | O₂ plasma purge | SiO₂ deposition (about 30nm) | O₂ plasma purge | SiO₂ deposition (about 30nm) | O₂ plasma purge | SiO₂ deposition (about 30nm) | O₂ plasma purge |

| O₂ plasma purge | SiO₂ deposition (about 30nm) | O₂ plasma purge | SiO₂ deposition (about 30nm) | N₂ purge (cyclic purge) | SiO₂ deposition (about 30nm) | N₂ purge (cyclic purge) | SiO₂ deposition (about 30nm) |

↑ Particle measurement ↑ Particle measurement ↑ Particle measurement ↑ Particle measurement

FIG.15

FILM FORMATION METHOD, FILM FORMATION APPARATUS, AND METHOD FOR USING FILM FORMATION APPARATUS

CROSS-REFERENCE TO RELATED PATENT APPLICATIONS

This application claims the benefit of priority from Japanese Patent Applications No. 2010-030634, filed on Feb. 15, 2010, and No. 2011-009704, filed on Jan. 20, 2011, in the Japan Patent Office, the disclosure of which is incorporated herein in the entirety by reference.

BACKGROUND OF THE INVENTION

1. Field of the Invention

The present invention relates to a film formation method, a film formation apparatus, and a method for using a film formation apparatus, for forming a silicon oxide film ($SiO_2$ film) on a target object by use of an Si source gas and an oxidizing agent, and particularly relates to a semiconductor process technique. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In the manufacturing sequence of semiconductor devices, there is a process for forming an $SiO_2$ film on a semiconductor wafer (which may be simply referred to as a wafer), such as a silicon wafer. In such a film formation process for forming an $SiO_2$ film, a vertical film formation apparatus of the batch type is often used to form an $SiO_2$ film on a plurality of semiconductor wafers together at a time by chemical vapor deposition (CVD) using an Si source and an oxidizing agent.

In recent years, owing to the demands for increased miniaturization and integration of semiconductor devices, it has been required to form an $SiO_2$ film of higher quality at a low temperature of 400° C. or less. As a technique for fulfilling the demands, there has been proposed a technique for forming an $SiO_2$ film by ALD (Atomic Layer Deposition) that alternately supplies an Si source gas and an oxidizing agent to laminate layers of an atomic layer level or molecular layer level (for example, Jpn. Pat. Appln. KOKAI Publication No. 2003-7700 (Patent Document 1)).

In film formation processes of an $SiO_2$ film performed by CVD or ALD, a film formation process is repeated for a plurality of wafers. For example, in vertical heat processing apparatuses of the batch type, a wafer boat with a batch of wafers placed thereon is loaded into a process container, and a film formation process is performed on these wafers. Then, a wafer boat (or the wafer boat) with another batch of wafers placed thereon is loaded into the process container, and the film formation process is performed on these wafers. In this way, the film formation process is repeated a plurality of times.

However, as the thickness of films deposited on the inner surface of the process container is larger while the film formation process is repeated a plurality of times, the number of particles deposited on the wafers is suddenly increased. Particularly, in the case of ALD, which performs film formation at a lower temperature, this problem is prominent.

Jpn. Pat. Appln. KOKAI Publication No. 2006-351948 (Patent Document 2) and Jpn. Pat. Appln. KOKAI Publication No. 2008-140864 (Patent Document 3) disclose techniques to prevent particle generation due to film peeling, by reforming films deposited on the inner surface of the process container.

However, the techniques disclosed in the Patent Documents 2 and 3 are not arranged to solve problems about particles in film formation processes of an $SiO_2$ film performed by CVD or ALD.

BRIEF SUMMARY OF THE INVENTION

Accordingly, an object of the present invention is to decrease the number of particles to be deposited on a target object in repeating a film formation process for forming an $SiO_2$ film on the target object by use of an Si source gas and an oxidizing agent.

In the process of developing the present invention, the inventors conducted researches on the problem described above, and have arrived at the findings given below. Specifically, where an $SiO_2$ film is formed on a target object by use of an Si source gas and an oxidizing agent, $SiO_2$ films are also deposited on the inner surface of the process container. The $SiO_2$ films deposited on the inner surface of the process container, particularly on portions outside the process field, contain unreacted Si-containing substances. During the film formation process, the Si-containing substances are emitted as out gases. As the thickness of $SiO_2$ films deposited on the inner surface of the process container is larger while the film formation process is repeated, Si-containing substances emitted as out gases during the film formation process are suddenly increased. The Si-containing substances emitted as out gases cause a gas phase reaction with the oxidizing agent and generate particles, which are then deposited on the target object.

According to a first aspect of the present invention, there is provided a film formation method comprising: a film formation process for forming an $SiO_2$ film on a surface of a target object inside a process container by use of an Si source gas and an oxidizing agent; and an oxidation purge process for performing oxidation on films deposited inside the process container while exhausting gas from inside the process container after unloading the target object from the process container, wherein the film formation process and the oxidation purge process are alternately repeated a plurality of times without, interposed therebetween, a process for removing the films deposited inside the process container.

According to a second aspect of the present invention, there is provided a film formation apparatus comprising: a vertical process container configured to hold a vacuum state therein; a holding member configured to support a plurality of target objects at intervals in vertical direction inside the process container; a loading mechanism configured to load and unload the holding member to and from the process container; an Si source gas supply mechanism configured to supply an Si source gas into the process container; an oxidizing agent supply mechanism configured to supply an oxidizing agent into the process container; an exhausting system configured to exhaust gas from inside the process container; and a control mechanism configured to control an operation of the apparatus, the control mechanism including a control program to control the apparatus to conduct a film formation method that comprises: a film formation process for forming an $SiO_2$ film on a surface of the target object inside the process container by use of the Si source gas supplied from the Si source gas supply mechanism and the oxidizing agent supplied from the oxidizing agent supply mechanism; and an oxidation purge process for performing oxidation on films deposited inside the process container while exhausting gas from inside the process container after unloading the target object from the process container, wherein the film formation process and the oxidation purge process are alternately repeated a plurality of times without, interposed therebetween, a process for removing the films deposited inside the process container.

According to a third aspect of the present invention, there is provided a method for using a film formation apparatus, which includes a vertical process container configured to hold a vacuum state therein, a holding member configured to support a plurality of target objects at intervals in vertical direction inside the process container, a source gas supply system configured to supply diisopropylamino silane (DIPAS) gas as an Si source gas into the process container, an oxygen-containing gas supply system configured to supply an oxygen-containing gas into the process container, a plasma generation mechanism disposed on the process container and configured to turn the oxygen-containing gas into plasma, and an exhausting system configured to exhaust gas from inside the process container, the method comprising a film formation process for forming a silicon oxide film on one batch of product target objects, and an oxidation purge process for performing oxidation on by-product films deposited inside the process container in a state where no product target objects present inside the process container, wherein the film formation process and the oxidation purge process are alternately repeated a plurality of times without, interposed therebetween, a process for removing the by-product films deposited inside the process container, the film formation process being performed by use of a film formation process temperature inside the process container set at room temperature, and comprising: supplying the DIPAS gas from the source gas supply system into the process container while exhausting gas from inside the process container by the exhausting system; and supplying the oxygen-containing gas from the oxygen-containing gas supply system into the process container while exhausting gas from inside the process container by the exhausting system, wherein said supplying the oxygen-containing gas includes turning the oxygen-containing gas into plasma by the plasma generation mechanism to generate radicals from the oxygen-containing gas and to oxidize, by the radicals, substances derived from the DIPAS gas to form the silicon oxide film, and the oxidation purge process being performed by use of an oxidation purge process temperature inside the process container set at room temperature, and comprising: supplying the oxygen-containing gas from the oxygen-containing gas supply system into the process container, without supplying the DIPAS gas from the source gas supply system into the process container, while exhausting gas from inside the process container by the exhausting system, wherein said supplying the oxygen-containing gas includes turning the oxygen-containing gas into plasma by the plasma generation mechanism to generate radicals from the oxygen-containing gas and to perform oxidation on the by-product films by the radicals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 10A is a diagram showing a sequence repeating, 4 times, film formation of forming an $SiO_2$ film with a thickness of about 30 nm on wafers by ALD using an amino silane and $O_2$ plasma, followed by cyclic purge using $N_2$ gas without unloading the wafers therebetween;

FIG. 10B is a diagram showing a sequence using $O_2$ plasma purge (oxidation purge) in place of the cyclic purge in the sequence shown in FIG. 10A;

FIG. 15 is a diagram for explaining an experiment performed to compare a conventional method with a method according to an embodiment of the present invention;

DETAILED DESCRIPTION OF THE INVENTION

Figure 1:
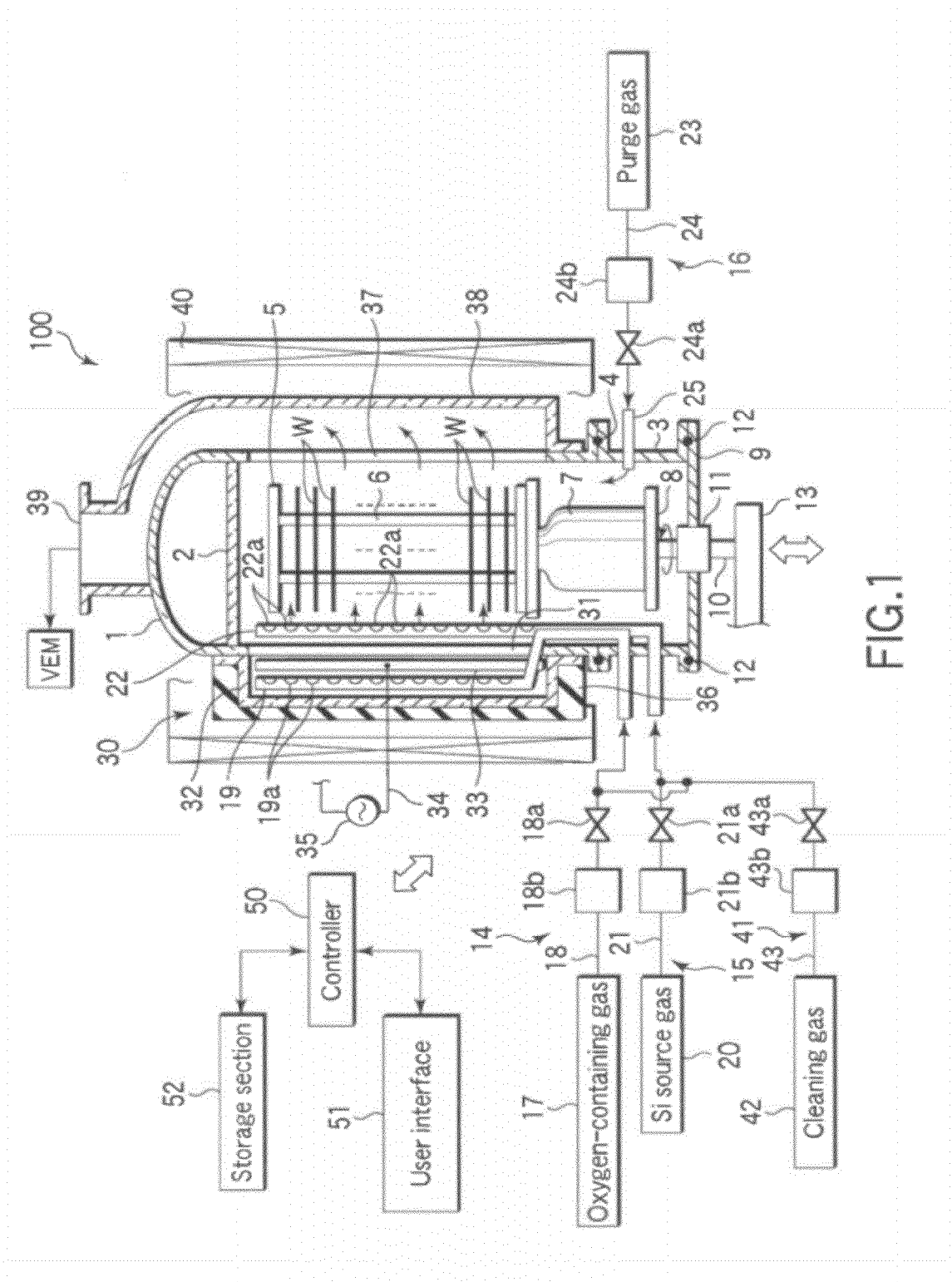
FIG. 1 is a sectional front view showing a film formation apparatus (a vertical plasma ALD apparatus) according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
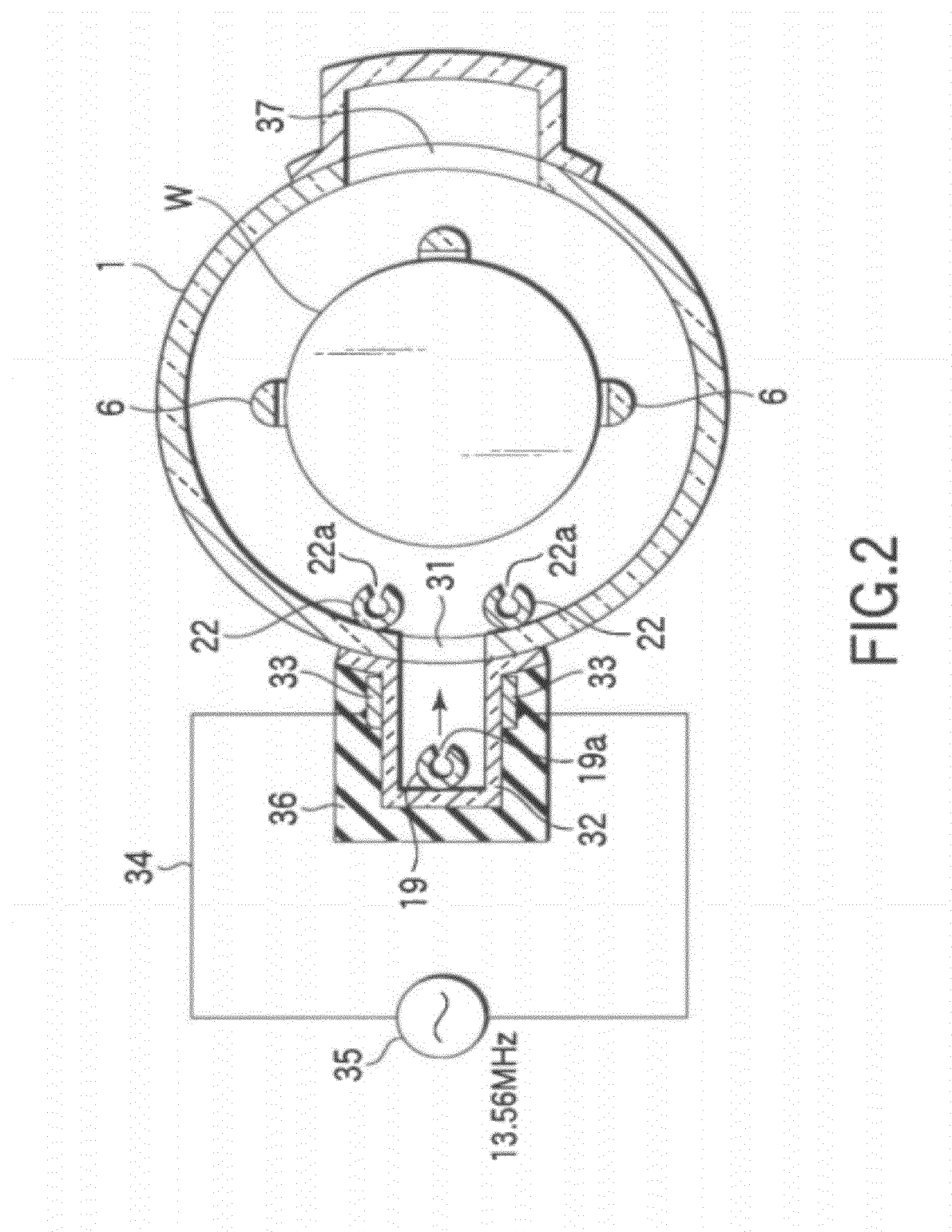
FIG. 2 is a sectional plan view showing part of the apparatus shown in FIG. 1.

FIG. 1 is a sectional front view showing a film formation apparatus (a vertical plasma ALD apparatus) according to an embodiment of the present invention. FIG. 2 is a sectional plan view showing part of the apparatus shown in FIG. 1. In FIG. 2, a heating mechanism is not shown.

The film formation apparatus 100 is designed to form an $SiO_2$ film by use of an Si source gas and an oxidizing agent and includes a process container 1 shaped as a cylindrical column with an opened bottom and closed top. The entirety of the process container 1 is made of, e.g., quartz. The process container 1 is equipped with a quartz ceiling plate 2 disposed therein near the top to airtightly seal the area below the ceiling plate 2. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on the wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is equipped with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison to transfer the wafer boat 5 into and from the process container 1. The table 8 may be fixed to the lid 9, so that wafers W are processed without rotation of the wafer boat 5.

The film formation apparatus 100 includes an oxygen-containing gas supply mechanism 14, an Si source gas supply mechanism 15, a purge gas supply mechanism 16, and a cleaning gas supply mechanism 41. The oxygen-containing gas supply mechanism 14 is arranged to supply an oxygen-containing gas, such as $O_2$ gas, into the process container 1 to generate oxygen-containing plasma serving as the oxidizing agent. The Si source gas supply mechanism 15 is arranged to supply an Si source gas into the process container 1. The purge gas supply mechanism 16 is arranged to supply an inactive gas, such as $N_2$ gas, serving as a purge gas into the process container 1. The cleaning gas supply mechanism 41 is arranged to supply a cleaning gas, such as a fluorine-containing gas, e.g., HF gas or $F_2$ gas, into the process container 1.

The oxygen-containing gas supply mechanism 14 includes an oxygen-containing gas supply source 17 and a gas distribution nozzle 19 connected to each other through a gas line 18 for supplying the oxygen-containing gas. The gas distribution nozzle 19 is formed of a quartz pipe that penetrates the sidewall of the manifold 3 from outside and then turns and extends vertically upward. The vertical portion of the gas distribution nozzle 19 has a plurality of gas spouting holes 19a formed thereon at predetermined intervals over the vertical length corresponding to the wafer supporting span of the wafer boat 5. Consequently, the oxygen-containing gas, such as $O_2$ gas, is almost uniformly spouted in horizontal directions from the gas spouting holes 19a toward the inner side of the process container 1.

The Si source gas supply mechanism 15 includes an Si source gas supply source 20 and a gas distribution nozzles 22 connected to each other through a gas line 21 for supplying the Si source gas. In this embodiment, there are two gas distribution nozzles 22 for the Si source gas (see FIG. 2). Each of the gas distribution nozzles 22 is formed of a quartz pipe that penetrates the sidewall of the manifold 3 from outside and then turns and extends vertically upward. The vertical portion of each of the gas distribution nozzles 22 also has a plurality of gas spouting holes 22a formed thereon at predetermined intervals over the vertical length corresponding to the wafer supporting span of the wafer boat 5. Consequently, the Si source gas is almost uniformly spouted in horizontal directions from the gas spouting holes 22a toward the inner side of the process container 1. Only one gas distribution nozzles 22 may be disposed for the Si source gas.

The purge gas supply mechanism 16 includes a purge gas supply source 23 and a gas nozzle 25 connected to each other through a gas line 24 for supplying the purge gas. The gas nozzle 25 is formed of a short quartz pipe that penetrates the sidewall of the manifold 3 from outside. An inactive gas, such as $N_2$ gas, is preferably used as the purge gas.

The cleaning gas supply mechanism 41 includes a gas supply source 42 of the cleaning gas and a gas line 43 extending from the gas supply source 42. The gas line 43 forks on the way to two lines connected to the gas line 18 and gas line 21.

The gas lines 18, 21, 24, and 43 are respectively equipped with switching valves 18a, 21a, 24a, and 43a and flow rate controllers 18b, 21b, 24b, and 43b, such as mass flow controllers. Consequently, the oxygen-containing gas, Si source gas, purge gas, and cleaning gas can be supplied at controlled flow rates.

A plasma generating mechanism 30 is formed on a part of the sidewall of the process container 1 to turn the oxygen-containing gas into plasma to generate oxygen-containing plasma serving as an oxidizing agent. The plasma generating mechanism 30 has a vertically long narrow opening 31 formed by cutting a predetermined width of the sidewall of the process container 1 in the vertical direction. The opening 31 is covered with a plasma cover wall 32 airtightly connected to the outer surface of the process container 1 by welding. The plasma cover wall 32 is formed of, e.g., quartz and has a vertical long narrow shape with a concave cross-section.

A pair of long narrow plasma electrodes 33 are disposed on the opposite outer surfaces of the plasma cover wall 32, and face each other while extending in the vertical direction. The plasma electrodes 33 are connected to an RF (Radio Frequency) power supply 35 for supplying an RF power through feed lines 34. An RF voltage of, e.g., 13.56 MHz is applied from the power supply 35 to the plasma electrodes 33 to generate plasma of the oxygen-containing gas. The frequency of the RF voltage is not limited to 13.56 MHz, and it may be set at another frequency, e.g., 400 kHz.

The plasma cover wall 32 described above is formed such that the sidewall of the process container 1 projects outward to define an inner concave, while the inner space of the plasma cover wall 32 communicates with the inner space of the process container 1. The inner space of the plasma cover wall 32 and the opening 31 have a vertical length sufficient to cover all the wafers W on the wafer boat 5 in the vertical direction.

The gas distribution nozzle 19 for the oxygen-containing gas is bent outward in the radial direction of the process container 1 while it extends upward inside the process container 1. Then, the gas distribution nozzle 19 vertically extends at the deepest position (the farthest position from the center of the process container 1) inside the plasma cover wall 32. When the RF power supply 35 is turned on and an RF electric field is thereby formed between the two electrodes 33, the oxygen-containing gas spouted from the gas spouting holes 19a of the gas distribution nozzle 19 is turned into plasma and is supplied and diffused toward the center of the process container 1.

An insulating protection cover 36 made of, e.g., quartz is attached on and covers the outer surface of the plasma cover wall 32. A coolant passages (not shown) are formed inside the insulating protection cover 36 and can be supplied with a coolant, such as cooled nitrogen gas, to cool the plasma electrodes 33.

The two gas distribution nozzles 22 extend upward at the opposite positions sandwiching the opening 31 inside the sidewall of the process container 1. The Si source gas is spouted from the gas spouting holes 22a of the gas distribution nozzles 22 toward the center of the process container 1.

On the other hand, on the side of the process container 1 opposite to the opening 31, the process container 1 has an exhaust port 37 formed thereon for vacuum-exhausting the interior of the process container 1. The exhaust port 37 has a long narrow shape formed by cutting the sidewall of the process container 1 in the vertical direction. The exhaust port 37 is covered with an exhaust port cover member 38 having a U-shape cross-section and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism VEM including a vacuum pump and so forth. The process container 1 is surrounded by a cylindrical heating mechanism 40 for heating the process container 1 and the wafers W inside the process container 1.

The film formation apparatus 100 includes a controller 50 comprising a microprocessor (computer), which controls the respective components in the film formation apparatus 100. For example, the controller 50 controls the valves 18a, 21a, 24a, and 43a to supply/stop the gases by opening/closing them, the mass flow controllers 18b, 21b, 24b, and 43b to adjust the flow rates of the gases, the vacuum-exhaust mechanism to exhaust gas, the RF power supply 35 to turn on/off an RF power, and the heating mechanism 40 to adjust the temperature of the wafers W. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. The recipes are stored in a storage medium included in the storage section 52. The storage medium may be formed of a medium of the stationary type, such as a hard disk or semiconductor memory, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 52 and executed by the controller 50 in accordance with an instruction or the like input through the user interface 51. Consequently, the film formation apparatus 100 can perform a predetermined process in accordance with the retrieved recipe under the control of the controller 50.

Figure 3:
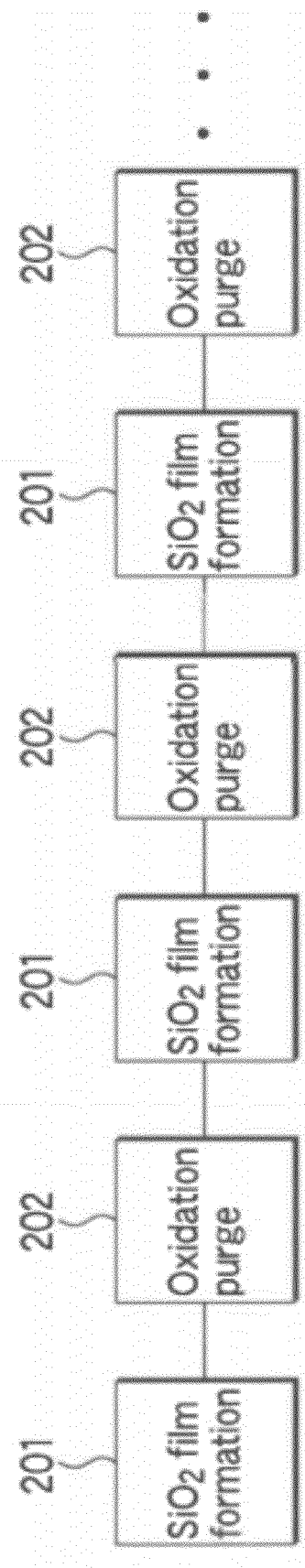
FIG. 3 is a diagram for explaining a film formation method according to an embodiment of the present invention.
Figure 4:
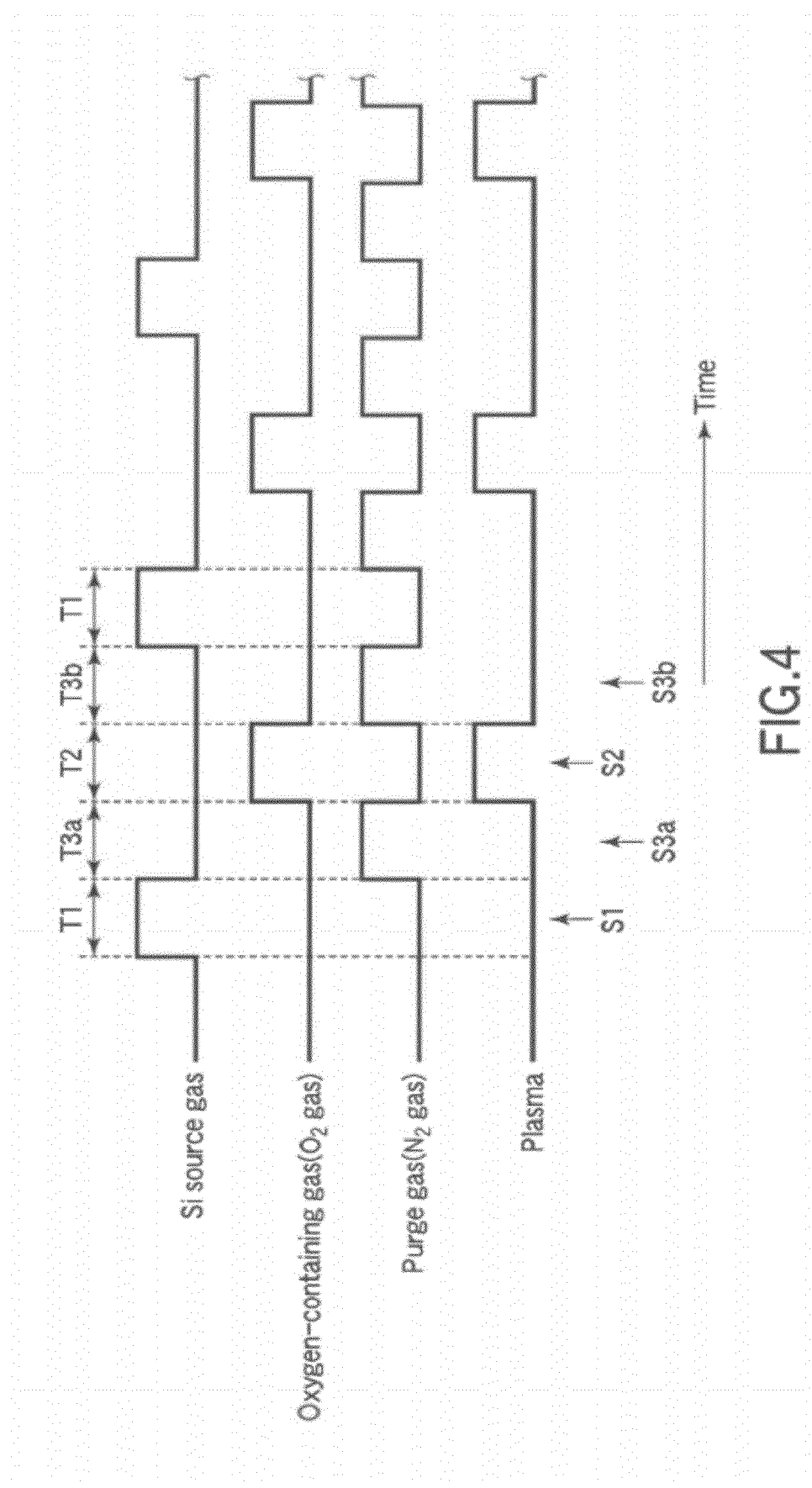
FIG. 4 is a timing chart showing the gas supply timing of a film formation process incorporated in the film formation method of FIG. 3.

Next, an explanation will be given of a method for forming a silicon oxide film ($SiO_2$ film), according to an embodiment of the present invention, performed in the film formation apparatus having the structure described above, with reference to FIGS. 3 and 4. FIG. 3 is a diagram for explaining a film formation method according to this embodiment. FIG. 4 is a timing chart showing the gas supply timing of a film formation process incorporated in the film formation method of FIG. 3.

In this embodiment, as shown in FIG. 3, a film formation process 201 is performed to form an $SiO_2$ film on wafers W (product wafers), the number of which is e.g., 50 to 100, placed on the wafer boat 5 inside the process container 1. The film formation process 201 is repeated for a plurality of batches of wafers W. While an operation for exchanging the wafer boat 5 is performed between the film formation processes on the respective batches, an oxidation purge process 202 is performed inside the process container 1 without wafers placed therein. In the oxidation purge process 202, the bottom port of the manifold 3 is closed and oxygen-containing plasma is generated inside the process container 1 to oxidize films (by-product films) deposited on the inner surface of the process container 1 while purging the process container 1. When the films deposited on the inner surface of the process container 1 become thick after the film formation process 201 is repeated for 10 to 1,000 batches, a dry cleaning process is performed to remove the films deposited on the inner surface of the process container 1.

In the film formation process 201, a number of, such as 50 to 100, semiconductor wafers W are placed on the wafer boat 5 at room temperature. Then, the wafer boat 5 with the wafers W placed thereon is loaded from below into the process container 1 adjusted at a predetermined temperature in advance. Then, the bottom port of the manifold 3 is closed by the lid 9 to set an airtight space inside the process container 1. For example, the wafers W have a diameter of 300 mm, although not limited thereto.

Then, the interior of the process container 1 is vacuum-exhausted and kept at a predetermined process pressure. Further, the electric power applied to the heating mechanism 40 is controlled to increase and set the wafer temperature to a process temperature, which is a predetermined temperature of not higher than 450° C. Then, while the wafer boat 5 is rotated, the film formation process is started. As described later, the process may be performed at about room temperature in some cases that make the heating mechanism 40 unnecessary.

As shown in FIG. 4, this film formation process is performed by so-called plasma ALD that alternately repeats a step S1 and a step S2. The step S1 is arranged to supply the Si source gas into the process container 1 to adsorb this gas on the wafers W. The step S2 is arranged to supply the oxidizing gas or oxygen-containing gas and turn it into plasma to generate oxygen-containing plasma (oxygen radicals) in the process container 1 to oxide the Si source gas adsorbed on the wafers W. Steps S3a and S3b are interposed between the steps 1 and 2 to remove the residual gas from inside the process container 1.

The Si source gas may be an amino silane gas, such as trisdimethylamino silane (3DMAS), tetrakisdimethylamino silane (4DMAS), bistertialbutylamino silane (BTBAS) or diisopropylamino silane (DIPAS).

Specifically, in the step S1, the Si source gas is supplied from the gas supply source 20 of the Si source gas supply mechanism 15 through the gas line 21 and gas distribution nozzles 22 and is spouted from the gas spouting holes 22a into the process container 1 for a time period T1. Consequently, the Si source gas is adsorbed on each of the semiconductor wafers. The time period T1 of this step is set to be, e.g., 1 to 180 sec. The flow rate of the Si source gas is set to be, e.g., 1 to 1,000 mL/min (sccm). The pressure inside the process container 1 is set to be, e.g., 13.3 to 1,333 Pa (0.1 to 10 Torr).

In the step S2, the oxygen-containing gas, such as $O_2$ gas, is supplied from the gas supply source 17 of the oxygen-containing gas supply mechanism 14 through the gas supply line 18 and gas distribution nozzle 19 and is spouted from the gas spouting holes 19a. At this time, the RF power supply 35 of the plasma generating mechanism 30 is set in an ON-state, as needed, to form an RF electric field, by which the oxygen-containing gas, such as $O_2$ gas, is turned into plasma. The oxygen-containing gas thus plasma-excited is then supplied as an oxidizing agent into the process container 1. Consequently, the Si source gas adsorbed on the wafers W is oxidized and turned into $SiO_2$. The time period T2 of this step is set to be, e.g., 1 to 300 sec. The flow rate of the oxygen-containing gas is set to be, e.g., 100 to 20,000 mL/min (sccm), although it depends on the number of semiconductor wafers W supported on the wafer boat 5. The RF power supply 35 is set to apply an RF power with, e.g., a frequency of 13.56 MHz, and a power of 5 to 1,000 W, and preferably of 10 to 250 W. The pressure inside the process container 1 is set to be, e.g., 13.3 to 1,333 Pa (0.1 to 10 Torr), and preferably to be 13.3 to 120 Pa (0.1 to 0.93 Torr).

In this step, the oxygen-containing gas may be $CO_2$ gas, NO gas, $N_2O$ gas, $H_2O$ gas, or $O_3$ gas in place of $O_2$ gas, and this alternative gas is also turned into plasma by the RF electric field, as needed, when used as the oxidizing agent. However, preferably, the oxidizing agent is $O_2$ plasma. Where $O_3$ gas is used, it is unnecessary to use plasma.

The steps S3a and S3b interposed between the step S1 and step S2 are used to remove the residual gas from inside the process container 1 after the step S1 or step S2, to cause a desired reaction in the subsequent step. Specifically, in these steps, while the interior of the process container 1 is vacuum-exhausted, an inactive gas, such as $N_2$ gas, serving as a purge gas is supplied from the gas supply source 23 of the purge gas supply mechanism 16 through gas line 24 and gas nozzle 25 into the process container 1. Each of the time periods T3a and T3b of these steps S3a and S3b is set to be, e.g., 1 to 60 sec. The flow rate of the purge gas is set to be, e.g., 50 to 20,000 mL/min (sccm). Each of the steps S3a and S3b may be arranged to continuously vacuum-exhaust the process container 1 without supplying the purge gas, i.e., without performing the supply of any of the gases, if the residual gas can be removed from inside the process container 1. However, supplying the purge gas shortens the time necessary for removing the residual gas from inside the process container 1. In these steps, the pressure inside the process container 1 is set to be, e.g., 13.3 to 1,333 Pa (0.1 to 10 Torr).

As described above, the step S1 of supplying the S1 source gas and the step S2 of supplying the oxygen-containing plasma including oxygen radicals are alternately repeated with the steps S3a and S3b of removing the residual gas from inside the process container 1 interposed therebetween. Consequently, thin $SiO_2$ layers are repeatedly laminated one by one to complete a $SiO_2$ film having a predetermined thickness. The number of repetition of this cycle is suitably determined in accordance with the thickness of the completed $SiO_2$ film.

The oxidation purge process is performed after the film formation process is finished and the wafer boat 5 with the processed wafers W is unloaded from the process container 1. The oxidation purge process is performed while the apparatus is in an idling state after a batch of wafers W subjected to the film formation process is unloaded from the process container 1 and before a next batch of wafers W to be subjected to the film formation process is loaded into the process container 1. This idling state of the apparatus is absolutely necessary in running the apparatus to perform operations for preparing the next batch of wafers W on the wafer boat 5, such as an operation of removing the processed batch of wafers W from around the apparatus, an operation of carrying the next batch of wafers W to a predetermined position around the apparatus, and an operation of heaping the next batch of wafers W onto the wafer boat 5. Accordingly, where the oxidation purge process is performed while the apparatus is in such an idling state, it is possible to prevent the apparatus from increasing downtime.

In the oxidation purge process, the interior of the empty process container 1 is vacuum-exhausted while an inactive gas, such as $N_2$ gas, serving as a purge gas is supplied from the gas supply source 23 of the purge gas supply mechanism 16 through gas line 24 and gas nozzle 25 into the process container 1, to remove the residual gas from inside the process container 1. Then, the interior of the process container 1 is vacuum-exhausted to a pressure of about 0.133 to 1,333 Pa (0.001 to 10 Torr). Then, the oxygen-containing gas, such as $O_2$ gas, is supplied from the gas supply source 17 of the oxygen-containing gas supply mechanism 14 through the gas line 18 and gas distribution nozzle 19, and is spouted from the gas spouting holes 19a.

At this time, the RF power supply 35 of the plasma generating mechanism 30 is set in an ON-state, as needed, to form an RF electric field, by which the oxygen-containing gas, such as $O_2$ gas, is turned into plasma. The oxygen-containing gas thus plasma-excited is then supplied as an oxidizing agent into the process container 1. Consequently, oxidation is performed on the by-product films deposited inside the process container 1 and containing reactive Si-containing substances, which cause particle generation during the film formation process. The oxidation time period of this oxidation purge process is preferably set to be 60 to 3,600 sec. In this process, the oxygen-containing gas may be $CO_2$ gas, NO gas, $N_2O$ gas, $H_2O$ gas, or $O_3$ gas in place of $O_2$ gas, and this alternative gas is also turned into plasma by the RF electric field, as needed, when used as the oxidizing agent. However, preferably, the oxidizing agent is $O_2$ plasma. Where $O_3$ gas is used, it is unnecessary to use plasma.

After the film formation process described above is repeated for a predetermined number of batches of wafers W, a cleaning process is performed to remove the by-product films deposited inside the process container 1. For example, this cleaning process is performed after the cumulative film thickness of $SiO_2$ films (silicon oxide films) reaches a predetermined value of 2 to 5 μm due to repetition of the film formation process and before the film formation process is performed on the next batch of wafers W. The cumulative film thickness used for determining the timing of the cleaning process may be a theoretical value obtained by multiplying the thickness of an $SiO_2$ film formed by one film formation process as prescribed in its recipe. Alternatively, this cumulative film thickness may be a measurement value obtained by integrating actually measured values of the thickness of an $SiO_2$ film formed on a monitor wafer, which is placed along with product wafers W on the wafer boat 5 in the film formation process.

In the cleaning process, the wafer boat 5 without product wafers supported thereon is placed on the heat-insulating cylinder 7 and is loaded from below into the process container 1 heated at a predetermined temperature. Then, the bottom port of the manifold 3 is closed by the lid 9 to set an airtight space inside the process container 1. Then, a cleaning gas, such as a fluorine-containing gas, e.g., HF gas, $F_2$ gas, or $ClF_3$ gas is supplied from the cleaning gas supply source 42 through the gas lines 43, 18, and 21 and gas distribution nozzles 19 and 22 into the process container 1 while the interior of the process container 1 is vacuum-exhausted. This cleaning process removes reaction products deposited on the inner surface of the process container 1, wafer boat 5, heat-insulating cylinder 7, and gas distribution nozzles 19 and 22. The temperature inside the process container 1 during the cleaning process is preferably set to be 0 to 600° C., and more preferably to be 25 to 475° C.

Next, an explanation will be given of the reason as to why the oxidation purge process described above is effective to decrease the particles on wafers W.

According to the conventional method, where an $SiO_2$ film is formed in a vertical film formation apparatus of the batch type, the following sequence is repeated. At first, the film formation process is performed on one batch of wafers by use of an Si source gas and an oxygen-containing gas. Then, after this batch of wafers is unloaded along with the wafer boat from the process container, the process container is purged by an inactive gas supplied into the process container while the process container is vacuum-exhausted. Then, the film formation process is performed on the next batch of wafers. Then, after this batch of wafers is unloaded, the process container is purged by the inactive gas.

During the film formation process, while an $SiO_2$ film is deposited on the wafers, films made mainly of $SiO_2$ are also deposited on the inner surface of the process container. As the film formation process is repeated, the thickness of films deposited on the inner surface of the process container is larger. According to an experiment conducted by the present inventors, it has been found in the conventional method that the particles on wafers are suddenly increased when the thickness of films deposited on the inner surface of the process container exceeds a certain value.

Figure 5:
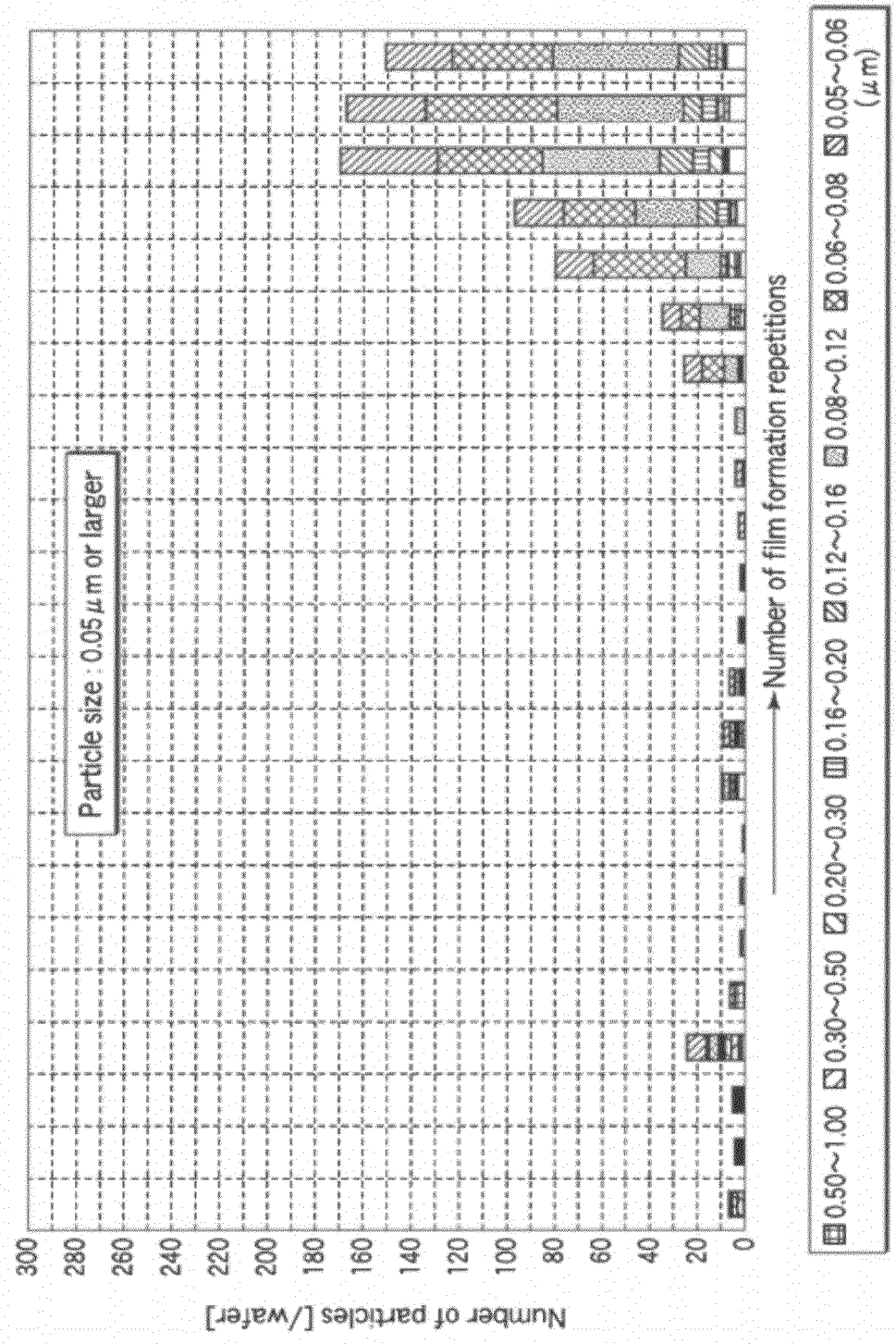
FIG. 5 is a graph showing the relationship of the number of particles of 0.05 μm or larger on a wafer with the number of film formation repetitions (cumulative film thickness), where the film formation was repeatedly performed by ALD using an amino silane as the Si source gas and $O_2$ plasma as the oxidizing agent.
Figure 6:
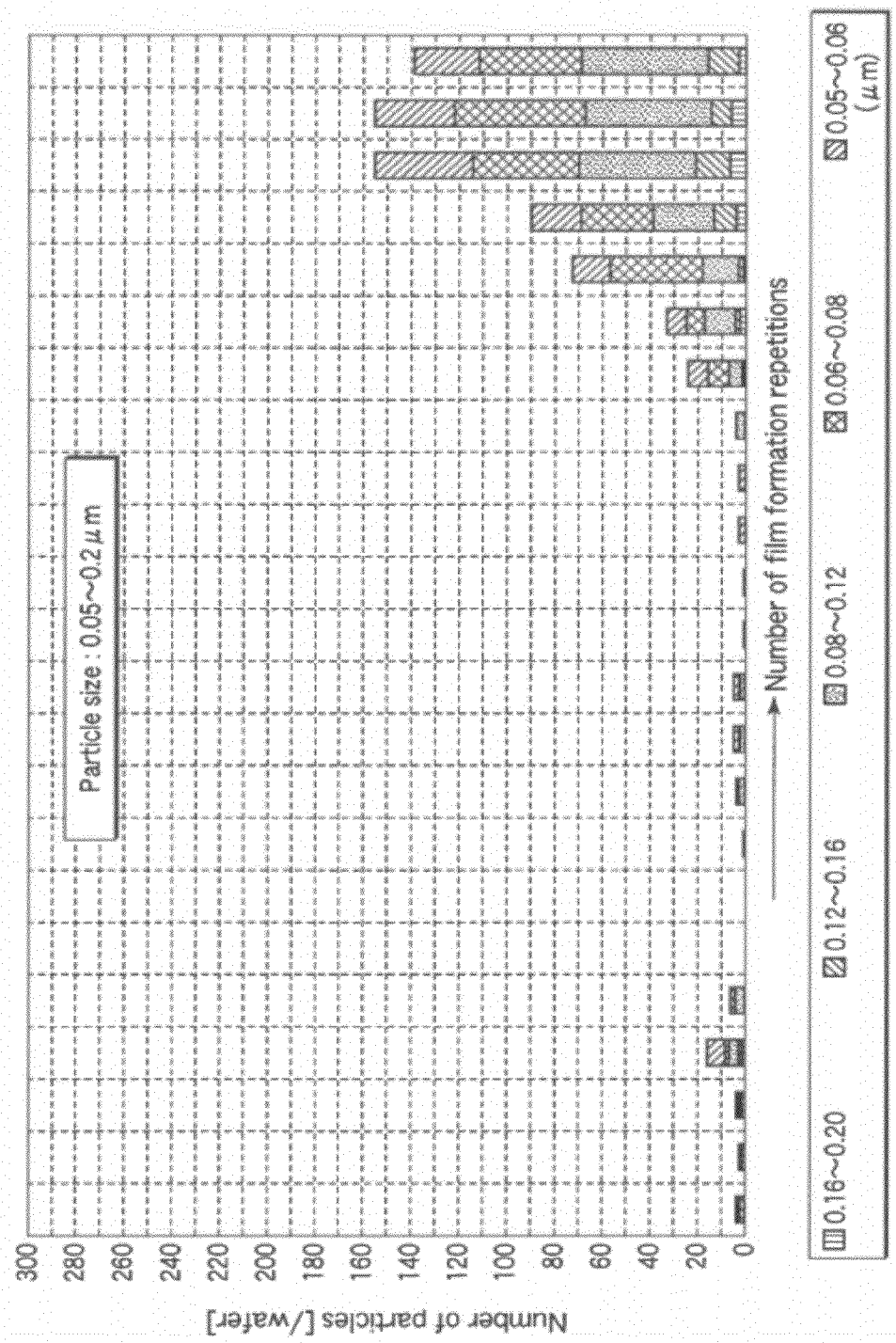
FIG. 6 is a graph showing the relationship of the number of minute particles of 0.05 to 0.2 μm with the number of film formation repetitions (cumulative film thickness) in the data shown in FIG. 5.
Figure 7:
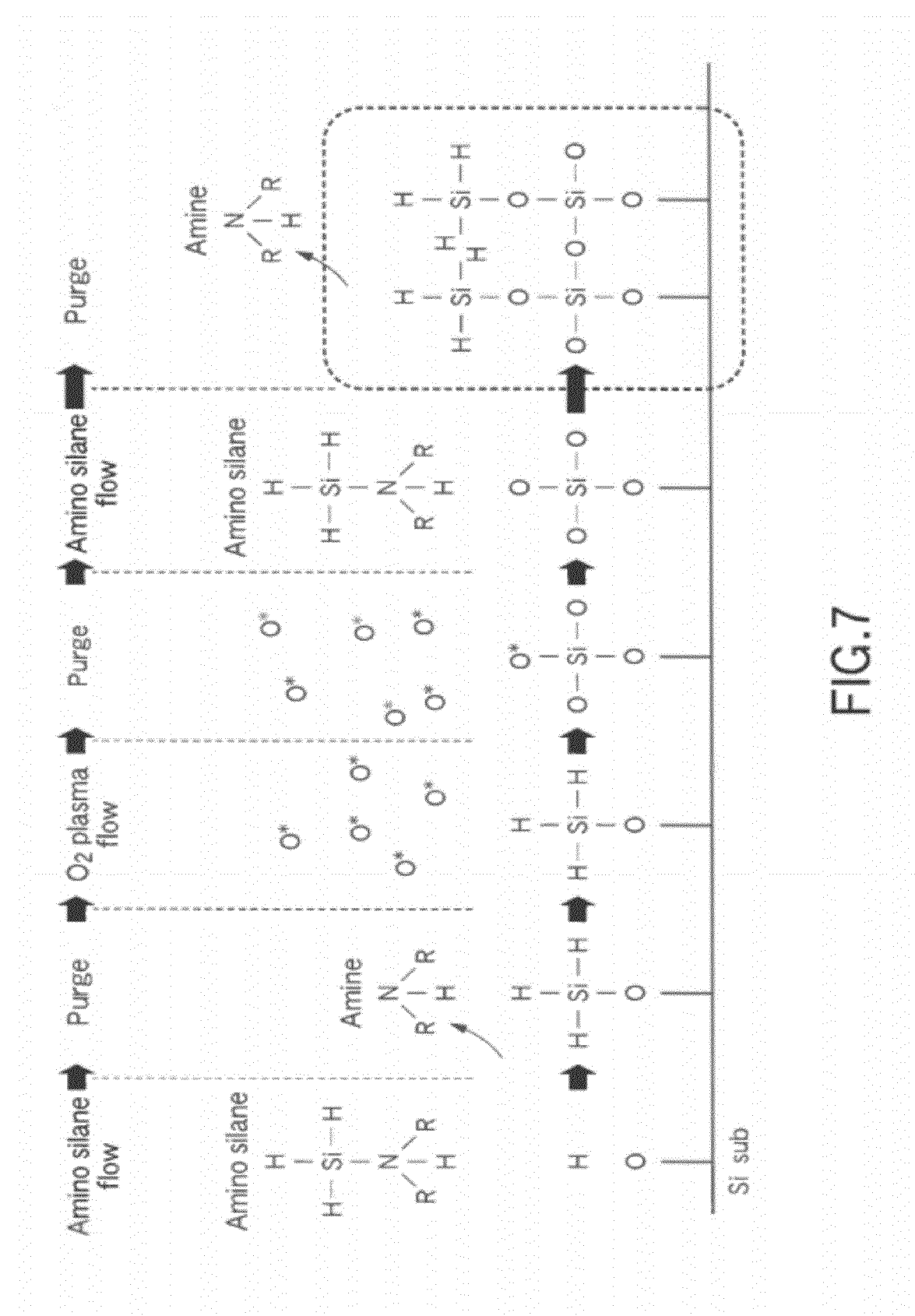
FIG. 7 is a schematic view showing a manner of forming an $SiO_2$ film by an ALD process using an amino silane as the Si source gas and $O_2$ plasma as the oxidizing agent.

An experiment was conducted such that ALD film formation was repeated by use of a univalenet amino silane (DIPAS) as the Si source gas and $O_2$ plasma as the oxidizing agent, and the number of particles of 0.05 μm or larger on the wafers was measured. FIG. 5 is a graph showing a result of this experiment. As shown in FIG. 5, the number of particles was increased with the number of repetitions of the film formation. FIG. 6 is a graph showing the relationship of the number of minute particles of 0.05 to 0.2 μm with the number of film formation repetitions (cumulative film thickness) in the data shown in FIG. 5. As shown in FIG. 6, most of the particles were minute particles falling within a range of 0.05 to 0.2 μm.

Where an $SiO_2$ film is formed by an ALD process by use of an amino silane as the Si source gas and $O_2$ plasma as the oxidizing agent, a sequence comprising amino silane flow, amino silane purge, $O_2$ plasma flow, and $O_2$ plasma purge in this order is repeated, as described above. FIG. 7 is a schematic view showing a manner of forming an $SiO_2$ film by an ALD process using an amino silane as the Si source gas and $O_2$ plasma as the oxidizing agent. As shown in FIG. 7, in the process of this film formation, amine is generated. In FIG. 7, R denotes a carbon hydride group, and O* denotes an oxygen radical. The reaction at this time is expressed by the following reaction formula (I).

$$\text{amino silane} + (O^*, O_2^*) \rightarrow SiO_2 + \text{amine} \uparrow \qquad (1)$$

Accordingly, it is presumed that, when $SiO_2$ films are deposited on the inner surface of the process container, amine-containing substances are contained in the film and then somehow contribute generation of minute particles of 0.05 to 0.2 μm. However, since amine is a gas component, it cannot be deposited alone on wafers. Further, even if amine reacts with the oxidizing agent in a mixed state, it does not become solid.

Figure 8:
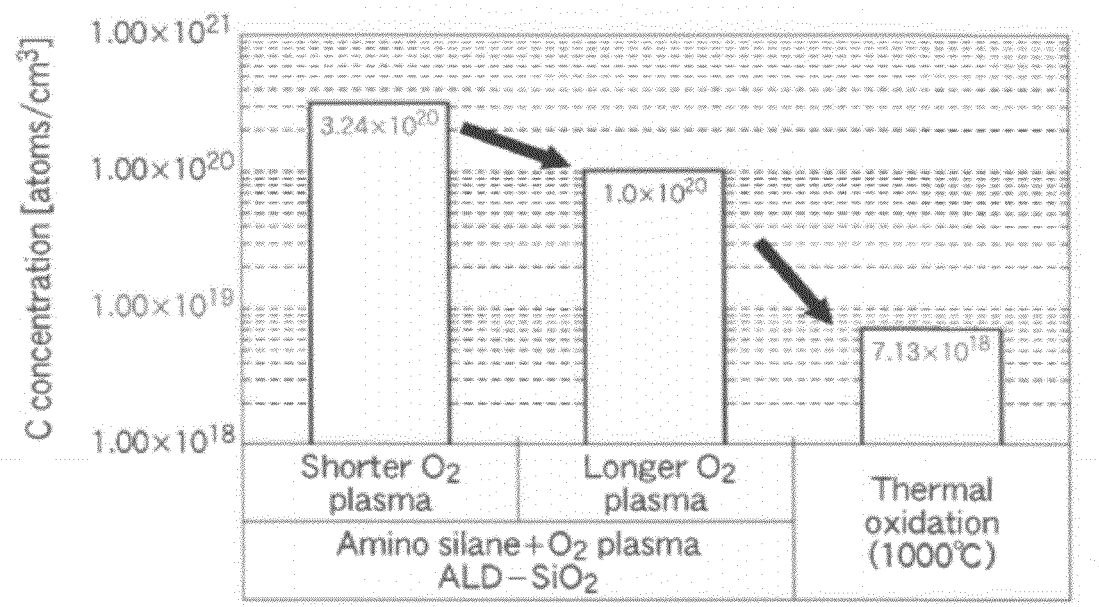
FIG. 8 is a graph showing the C concentration in $SiO_2$ films formed on wafers by ALD using an amino silane and $O_2$ plasma with longer and shorter times of $O_2$ plasma flow, and by thermal oxidation.
Figure 9:
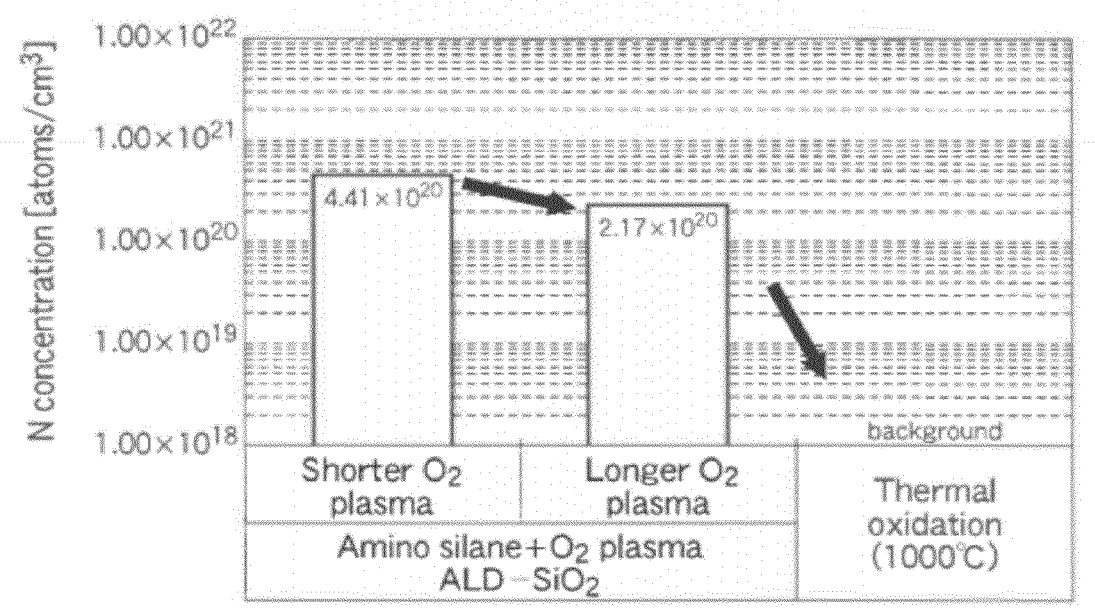
FIG. 9 is a graph showing the N concentration in $SiO_2$ films formed on wafers by ALD using an amino silane and $O_2$ plasma with longer and shorter times of $O_2$ plasma flow, and by thermal oxidation.

Another experiment was conducted such that an $SiO_2$ film was formed on wafers by ALD repeating a sequence comprising amino silane flow, amino silane purge, $O_2$ plasma flow, and $O_2$ plasma purge in this order, with longer and shorter times of $O_2$ plasma flow, and the C concentration and N concentration in the film was measured. For comparison, an $SiO_2$ film was formed by thermal oxidation at 1,000° C., and the C concentration and N concentration in the film was measured. FIG. 8 shows the C concentration and FIG. 9 shows the N concentration, both obtained by this experiment. As shown in FIGS. 8 and 9, as the $O_2$ plasma flow time (oxidation step time) of the ALD was longer, the C concentration and N concentration in the film were decreased. However, the C concentration and N concentration in the film were far larger than those in the $SiO_2$ film formed by the thermal oxidation performed without using any amino silane. It has been found from these results that C and N in the film are derived from amine-containing substances due to use of an amino silane, and the amine-containing substances can be decreased to some extent by prolonging the flow time of the oxidizing agent or $O_2$ plasma.

Another experiment was conducted to simulate the state of films deposited on the inner surface of the process container. In this experiment, wafers were loaded into the process container, and a film formation process was performed by ALD to form an $SiO_2$ film having a thickness of about 30 nm on the wafers by use of a univalenet amino silane as the Si source gas and $O_2$ plasma as the oxidizing agent. Then, without unloading the wafers, a post process corresponding to purging during batch exchange was performed. The film formation process and post process were repeated 4 times. Then, the carbon and nitrogen compounds in the $SiO_2$ film thus formed were analyzed by a temperature-programmed desorption gas analysis (TDS).

FIG. 10A is a diagram showing the sequence of a comparative example used in this experiment and employing, as the post process, cyclic purge using $N_2$ gas as the purge gas. FIG. 10B is a diagram showing the sequence of a present example used in this experiment and employing, as the post process, $O_2$ plasma purge (oxidation purge).

Figure 11A:
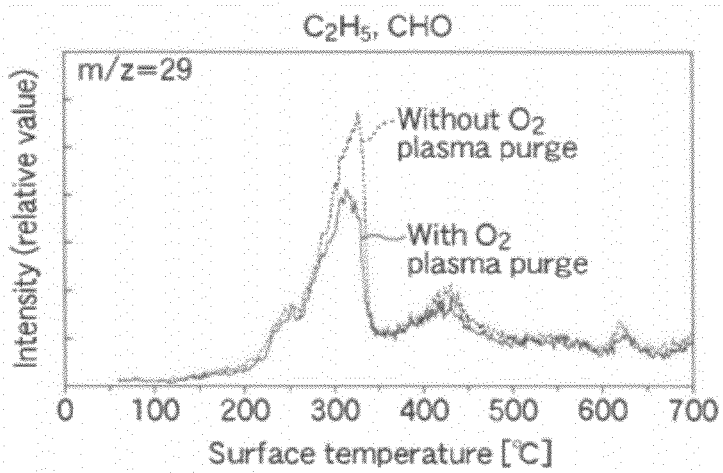
FIGS. 11A, 11B, and 11C are graphs showing results of analyses concerning carbon and nitrogen compounds in $SiO_2$ films formed by the sequences shown in FIGS. 10A and 10B.
Figure 11B:
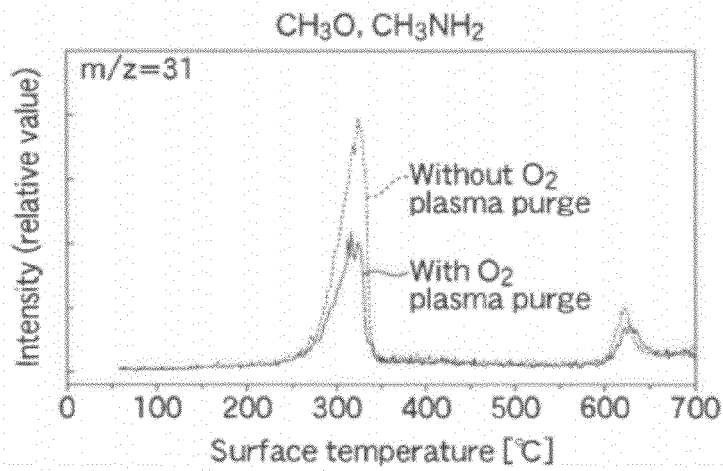
Figure 11C:
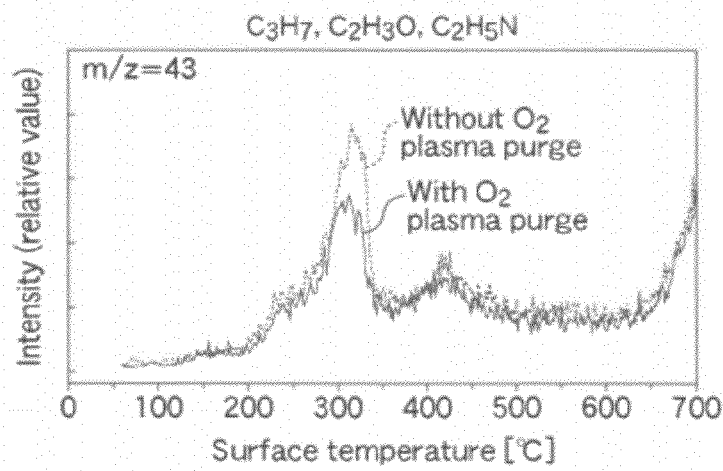

FIGS. 11A, 11B, and 11C are graphs showing results of analyses concerning carbon and nitrogen compounds in $SiO_2$ films formed by the sequences shown in FIGS. 10A and 10B. As shown in FIGS. 11A, 11B, and 11C, the carbon and nitrogen compounds were decreased by employing the $O_2$ plasma purge in place of the cyclic purge after the film formation process. It has been found from these results that amine-containing substances in the film deposited on the inner surface of the process container are decreased by performing the oxidation purge process using the $O_2$ plasma purge between the preceding film formation process and subsequent film formation process.

Figure 12:
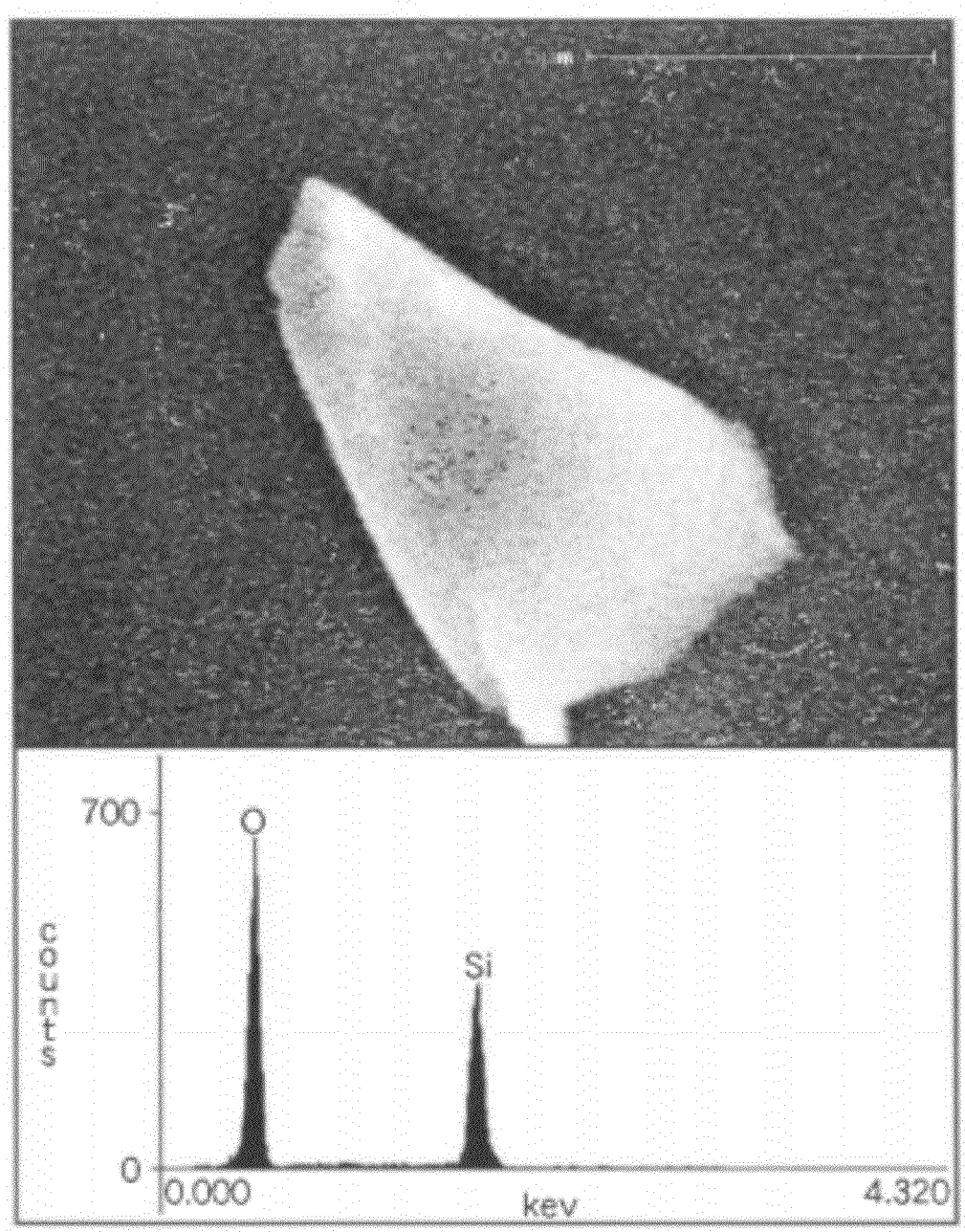
FIG. 12 is a view showing an SEM picture image of one of particles of larger 0.2 μm on wafers and an analysis result concerning the particles.
Figure 13:
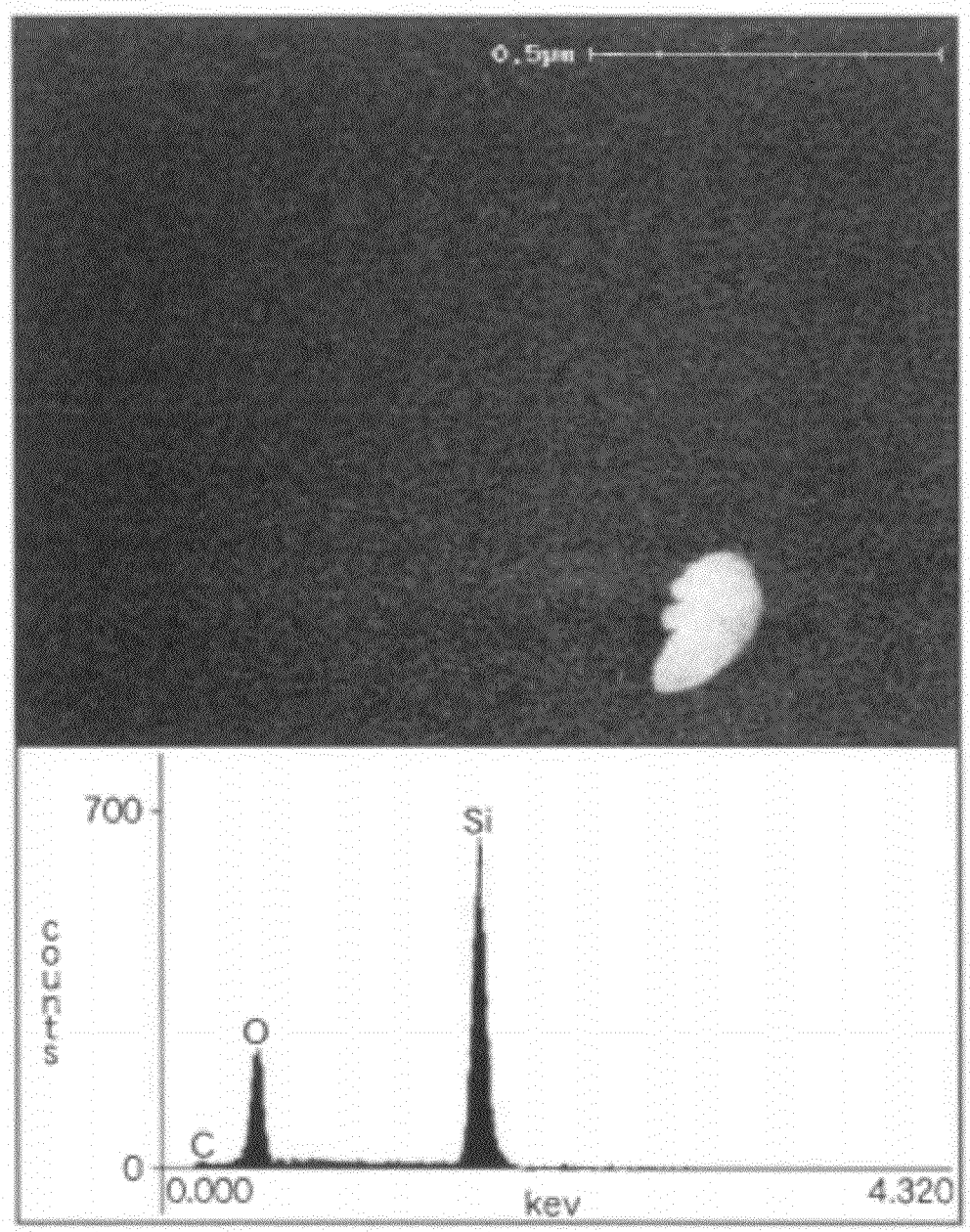
FIG. 13 is a view showing an SEM picture image of one of particles of 0.2 μm or smaller on wafers and an analysis result concerning the particles.

Then, the particles deposited on wafers were categorized into particles of larger than 0.2 μm and particles of 0.05 to 0.2 μm corresponding to the majority of the particles, and their pictures were taken by a scanning electron microscope (SEM), followed by a composition analysis using an energy dispersive X-ray analyzer (EDX). FIG. 12 is a view showing an SEM picture image of one of particles of larger 0.2 μm and an analysis result concerning the particles. FIG. 13 is a view showing an SEM picture image of one of particles of 0.05 to 0.2 μm and an analysis result concerning the particles. As shown in FIGS. 12 and 13, the particles of larger 0.2 μm had a shape like a fractured piece and rendered detection of Si and O with a peak intensity ratio of Si:O at about 1:2. It is thought from this result that the particles of larger 0.2 μm was generated by peeling of films deposited on the inner surface of the process container. On the other hand, the particles of 0.2 μm or smaller had a shape unlike a fractured piece and rendered detection of Si:O richer in Si than $SiO_2$ with a small amount of impurity, such as C. It is thought from this result that the particles of 0.2 μm or smaller was generated not by film peeling but by a gas phase reaction somehow.

As described above, it is presumed that, where film formation is performed by use of an amino silane as the Si source gas and $O_2$ plasma as the oxidizing agent, $SiO_2$ films deposited on the inner surface of the process container contain amine-containing substances, which are emitted and cause a gas phase reaction so that particles of 0.2 μm or smaller are generated. However, as described above, even if amine itself is emitted, particles are not generated, because amine is a gas component and cannot be deposited alone on wafers, and further amine does not become solid when it reacts with the oxidizing agent in a mixed state. Since the particles of 0.2 μm or smaller contain C or the like as well as Si, as described above, it is thought that amine-containing substances associated with the particles are in the form of not amine itself but unreacted amino silane.

In other words, the films deposited on the inner surface of the process container contains amine produced by the reaction and unreacted amino silane, as well as the main component $SiO_2$. When this unreacted amino silane is emitted into gaseous phase, it reacts with the $O_2$ plasma serving as an oxidizing agent and produces solid oxides, which are minute particles of 0.2 μm or smaller. Accordingly, in order to decrease minute particles, it is effective to decrease emission of amino silane from films, which have been deposited on the inner surface of the process container 1 during the film formation process. Accordingly, in this embodiment, the $O_2$ plasma purge (oxidation purge) is performed between the preceding film formation process and subsequent film formation process.

Figure 14A:
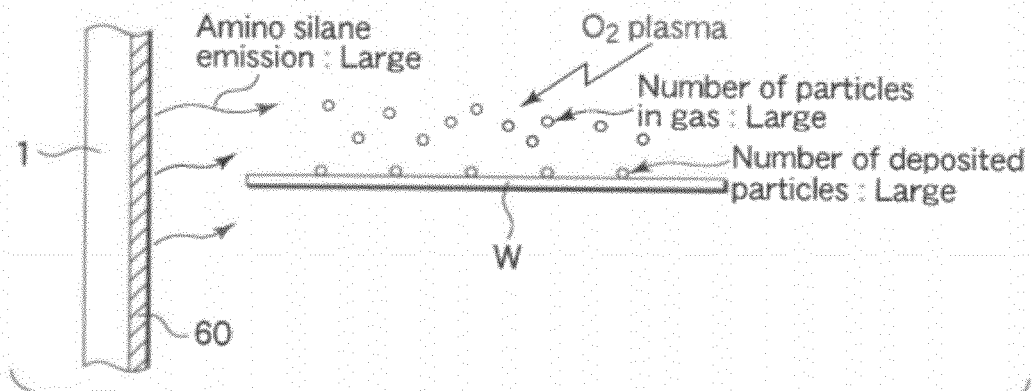
FIGS. 14A and 14B are schematic views showing a state inside the process container in forming an $SiO_2$ film by a conventional method and a method according to an embodiment of the present invention, respectively.
Figure 14B:
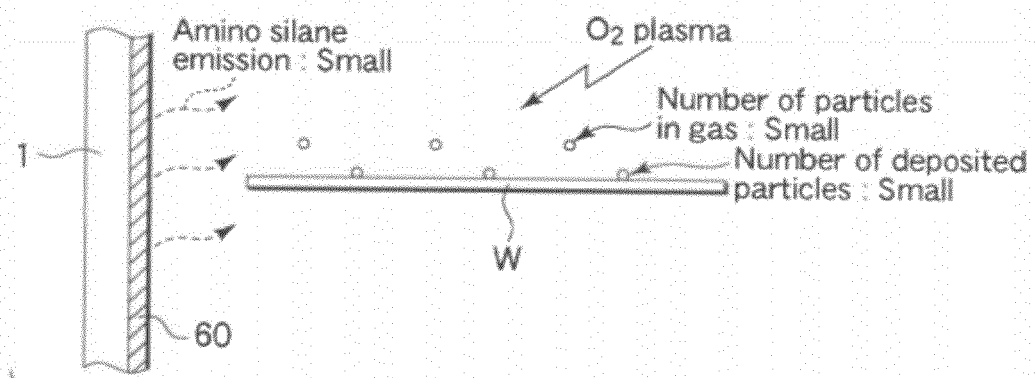

Conventionally, in place of the oxidation purge according to this embodiment, cyclic purge using an inactive gas is performed between film formation processes, and a large amount of amino silane remains in $SiO_2$ films 60 deposited on the inner surface of the process container 1. In this case, as shown in FIG. 14A, a large amount of amino silane gas is emitted from the $SiO_2$ films 60 deposited on the inner surface of the process container 1 during the next film formation process. This gas is oxidized by the $O_2$ plasma in gaseous phase and generates a lot of particles in gaseous phase, and so the number of particles deposited on the wafers W are increased. On the other hand, where the $O_2$ plasma purge (oxidation purge) is performed after the film formation process, the amount of amino silane remaining in the $SiO_2$ films 60 is decreased as compared with the case of employing the cyclic purge. In this case, as shown in FIG. 14B, only a smaller amount of amino silane gas is emitted from the $SiO_2$ films 60 deposited on the inner surface of the process container 1 during the next film formation process. Consequently, particles generated in gaseous phase are decreased, and so the number of particles deposited on the wafers W are decreased.

In this respect, this embodiment is completely different from those disclosed in the Patent Documents 2 and 3, which reform films deposited on the inner surface of the process container to prevent film peeling.

In this embodiment, the oxidizing gas used in the oxidation purge process may be the same as the oxidizing gas used in the $SiO_2$ film formation process. Further, the oxidizing gas used in the oxidation purge process may be supplied in the same manner as that in the $SiO_2$ film formation process (which is exemplified by $O_2$ plasma in this embodiment), thereby not requiring a special mechanism.

This phenomenon that $SiO_2$ films deposited on the inner surface of the process container contain an Si source gas, which is emitted during a process, happens in cases other than cases where an amino silane is used as the Si source gas.

In order to confirm effects of this embodiment, another experiment was conducted. FIG. 15 is a diagram for explaining an experiment performed to compare a conventional method with a method according to an embodiment of the present invention. In this experiment, as shown in FIG. 15, $O_2$ plasma purge (oxidation purge) was performed inside the process container without wafers loaded therein after the process container was set by a cumulative film thickness, with which the films deposited on the inner surface of the process container could generate a lot of particles. Then, wafers were loaded into the process container, and film formation of forming an $SiO_2$ film with a thickness of about 30 nm was performed on the wafers by ALD using a univalenet amino silane (DIPAS) as the Si source gas and $O_2$ plasma as the oxidizing agent. Then, the particles on the wafers were measured. This sequence was repeated 2 times. Thereafter, cyclic purge using $N_2$ gas was performed inside the process container without wafers loaded therein. Then, film formation of forming an $SiO_2$ film with a thickness of about 30 nm was performed on the wafers by ALD in the same way. Then, the particles on the wafers were measured. This sequence was repeated 2 times.

Figure 16:
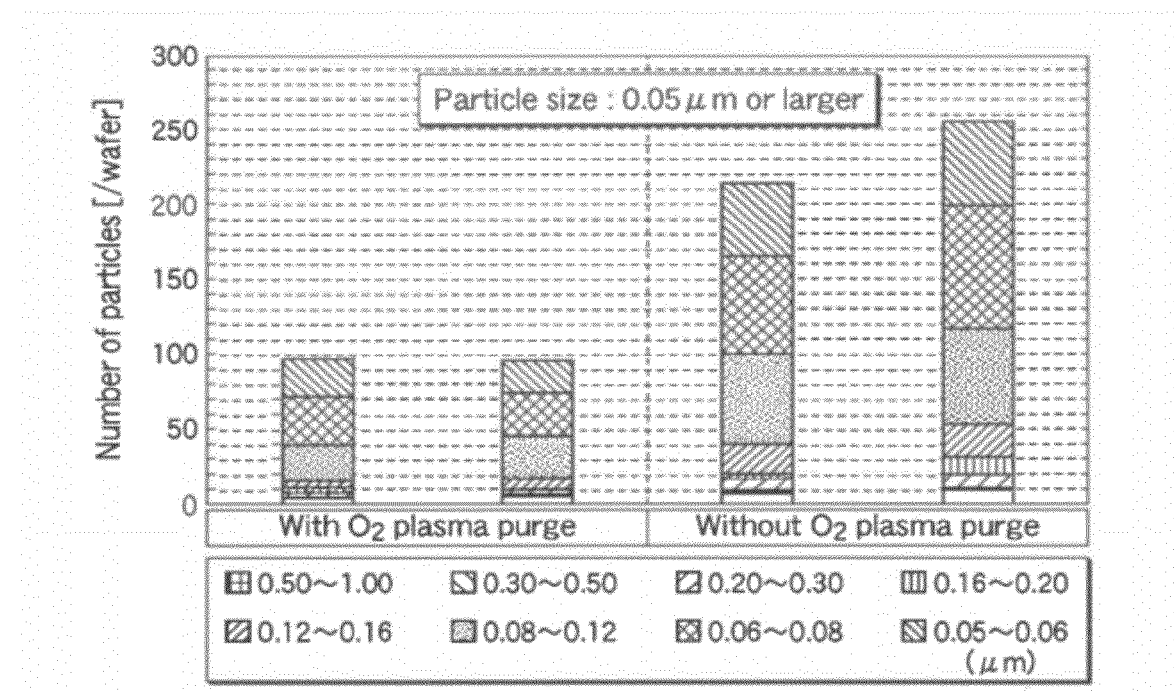
FIG. 16 is a graph showing the number of particles of 0.05 μm or larger on wafers obtained by a conventional method and a method according to an embodiment of the present invention.
Figure 17:
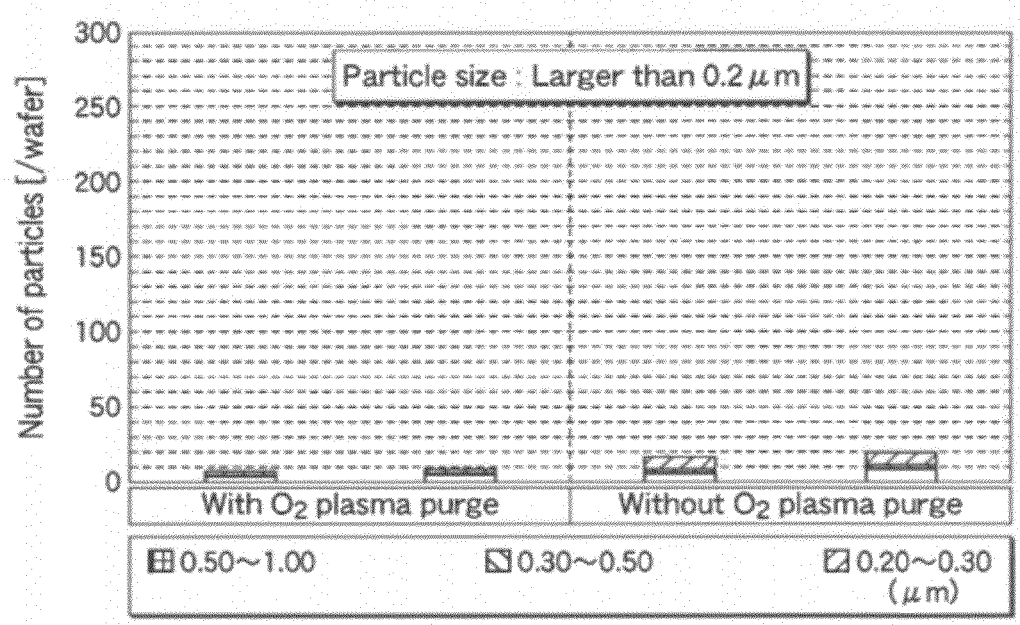
FIG. 17 is a graph showing the number of particles of larger than 0.2 μm in the data of particles shown in FIG. 16.
Figure 18:
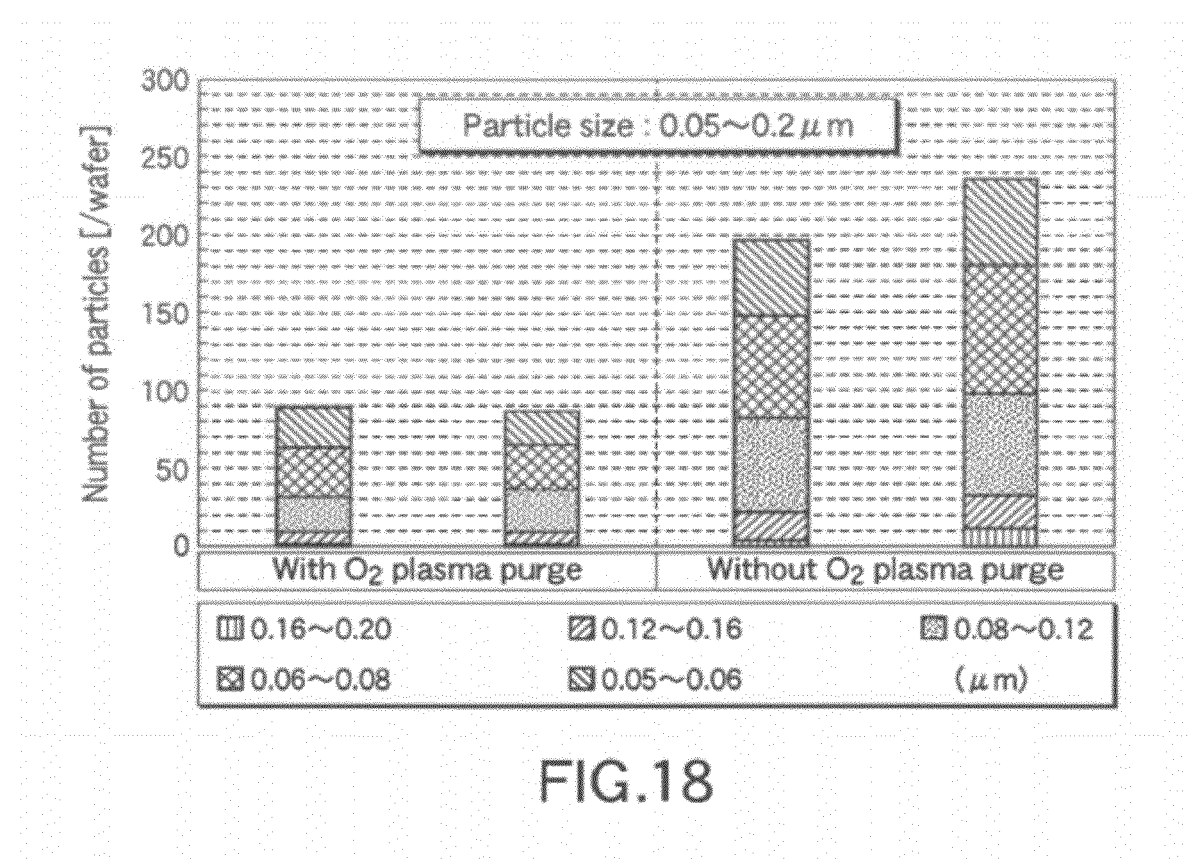
FIG. 18 is a graph showing the number of particles of 0.05 to 0.2 μm in the data of particles shown in FIG. 16.

FIG. 16 is a graph showing the number of particles of 0.05 μm or larger on wafers obtained by this experiment. FIG. 17 is a graph showing the number of particles of larger than 0.2 μm in the data of particles shown in FIG. 16. FIG. 18 is a graph showing the number of particles of 0.05 to 0.2 μm in the data of particles shown in FIG. 16. As shown in FIG. 16, the number of particles was decreased by performing the $O_2$ plasma purge, as compared with the case using the cyclic purge. As shown in FIGS. 17 and 18, the number of particles of larger 0.2 μm was very small and rendered no difference depending on the presence and absence of the $O_2$ plasma purge. Further, minute particles of 0.05 to 0.2 μm were the majority of the entire particles, and were decreased by use of the $O_2$ plasma purge.

Where the silicon oxide film ($SiO_2$ film) formation process, oxidation purge process, and by-product film cleaning process described above employ specific process gases and process conditions, these processes can be all performed at room temperature (20 to 30° C., such as 25° C.). Next, an explanation will be given of a method for using the film formation apparatus to realize a room temperature sequence.

In the film formation apparatus 100 shown in FIG. 1 for performing the room temperature sequence, the oxygen-containing gas supply source 17 is arranged to supply $O_2$ gas as the oxygen-containing gas. Alternatively, the oxygen-containing gas may be selected from $CO_2$ gas, NO gas, $N_2O$ gas, $H_2O$ gas, and $O_3$ gas. The Si source gas supply source 20 is arranged to supply diisopropylamino silane (DIPAS) gas. The cleaning gas supply source 42 is arranged to supply HF gas.

In the film formation process, the film formation process temperature in the process container 1 is set at room temperature, and ALD repeating the following cycle is performed while the interior of the process container 1 is exhausted by the vacuum-exhausted mechanism VEM. Specifically, at first, an adsorption step is performed by supplying the DIPAS gas into the process container 1 without supplying the $O_2$ gas into the process container 1. Consequently, an adsorption layer containing silicon is formed on the surface of the wafers W. Then, a first purge step is performed by exhausting gas from inside the process container 1 and supplying the inactive gas into the process container 1 without supplying either of the DIPAS gas and $O_2$ gas into the process container 1. Then, an oxidation step is performed by supplying the $O_2$ gas into the process container 1 without supplying the DIPAS gas into the process container 1. Consequently, the adsorption layer on the surface of the wafers W is oxidized. Then, a second purge step is performed by exhausting gas from inside the process container 1 and supplying the inactive gas into the process container 1 without supplying either of the DIPAS gas and $O_2$ gas into the process container 1.

In the adsorption step, the pressure inside the process container 1 is set to be 13.3 to 3,990 Pa (0.1 to 30 Torr), and preferably to be 13.3 to 666.5 Pa (0.1 to 5.0 Torr). In the oxidation step, the pressure inside the process container 1 is set to be 13.3 to 1,333 Pa (0.1 to 10 Torr), and preferably to be 13.33 to 120 Pa (0.1 to 0.93 Torr). In the oxidation step, the $O_2$ gas is turned into plasma by the plasma generating mechanism 30 and is supplied into the process container 1, while the plasma generation mechanism 30 is set with a pressure of less than 400 Pa therein and an RF power of 50 to 500 W, and preferably of 10 to 250 W, applied to the electrodes. Consequently, radicals derived from the $O_2$ gas are generated and oxidize the adsorption layer on the surface of the wafers W.

In the oxidation purge process, which is performed after the wafer boat 5 with the film-formed wafers W supported thereon is unloaded from the process container 1, the oxidation purge process temperature inside the process container 1 is set at room temperature, and the following operations are performed while the interior of the process container 1 is exhausted by the vacuum-exhausted mechanism VEM.

Specifically, at first, the interior of the process container 1 is vacuum-exhausted to a pressure of about 0.133 to 1,333 Pa (0.001 to 10 Torr). Then, a step is performed of supplying the $O_2$ gas into the process container 1 without supplying the DIPAS gas into the process container 1. In this step, the pressure inside the process container 1 is set to be 13.3 to 1,333 Pa (0.1 to 10 Torr), and preferably to be 13.3 to 120 Pa (0.1 to 0.93 Torr). Further, in this step, the $O_2$ gas is turned into plasma by the plasma generating mechanism 30 and is supplied into the process container 1, while the plasma generation mechanism 30 is set with a pressure of less than 400 Pa therein and an RF power of 10 to 500 W, and preferably of 50 to 250 W, applied to the electrodes. The time period of this step is set to be 60 to 3,600 sec. Consequently, radicals derived from the $O_2$ gas are generated and perform oxidation on the by-product films deposited inside the process container.

In the cleaning process, which is performed when the cumulative film thickness of silicon oxide films ($SiO_2$ films) reaches a predetermined value of 2 to 5 μm, the cleaning process temperature inside the process container 1 is set at room temperature, and the following operations are performed while the interior of the process container 1 is exhausted by the vacuum-exhausted mechanism VEM.

Specifically, at first, the interior of the process container 1 accommodating the wafer boat 5 without product wafers supported thereon is vacuum-exhausted to a pressure of about 0.133 to 1,333 Pa (0.001 to 10 Torr). Then, a step is performed of supplying HF gas into the process container 1 without supplying either of the $O_2$ gas and DIPAS gas into the process container 1. In this step, the pressure inside the process container 1 is set to be 13.3 to 101,325 Pa (0.1 to 760 Torr), and preferably to be 133 to 13,332 Pa (1 to 100 Torr). Consequently, the by-product films deposited inside the process container 1 is etched and removed by the HF gas.

The present invention is not limited to the embodiment described above, and it may be modified in various manners. For example, in the embodiment described above, the present invention is applied to a film formation apparatus of the batch type that performs film formation on a plurality of semiconductor wafers all together. Alternatively, the present invention may be applied to a film formation apparatus of the single-wafer type that performs film formation on wafers one by one.

In the embodiment described above, the film formation of forming an $SiO_2$ film is performed by ALD using an amino silane as the Si source gas and oxygen-containing plasma, such as $O_2$ plasma, as the oxidizing agent. Alternatively, in the present invention, another Si source gas, such as $SiH_4$, $SiH_3Cl$, $SiH_2Cl_2$, or $SiHCl_3$, may be used. The oxidizing agent is not limited to the oxygen-containing plasma, and it may be another activated species, such as ozone gas. Depending on the Si source gas, the oxidizing agent is not limited to activated species, and it may be the oxygen-containing gas itself, such as $O_2$ gas. The film formation process may be performed by CVD in place of ALD. However, since ALD tends to be performed at a lower film formation temperature, the formed film should contain a larger amount of residual Si source gas. Consequently, the present invention is more effective to a case where an $SiO_2$ film is formed by ALD.

In the embodiment described above, the oxidation purge is performed by use of oxygen-containing plasma, such as $O_2$ plasma, between the film formation processes. Alternatively, the oxidation purge may be performed by use of another activated species, such as ozone gas, as in the oxidation step of the film formation process. Also in this case, depending on the Si source gas, the oxidizing agent is not limited to activated species, and it may be the oxygen-containing gas itself, such as $O_2$ gas.

A target substrate is not limited to a semiconductor wafer, and the present invention may be applied to another substrate, such as an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method comprising:
    a film formation process for forming an $SiO_2$ film on a surface of a target object inside a process container by use of an Si source gas and an oxidizing agent; and
    an oxidation purge process for performing oxidation on films deposited inside the process container while exhausting gas from inside the process container after unloading the target object from the process container, wherein the film formation process and the oxidation purge process are alternately repeated a plurality of times without, interposed therebetween, a process for removing the films deposited inside the process container.

2. The method according to claim 1, wherein the Si source gas is an amino silane gas.

3. The method according to claim 1, wherein the oxidizing agent used in the film formation process is an oxygen-containing gas or plasma of an oxygen-containing gas.

4. The method according to claim 1, wherein the oxidizing agent used in the film formation process is an oxygen-containing gas that is at least one gas selected from the group consisting of $O_2$ gas, $CO_2$ gas, NO gas, $N_2O$ gas, $H_2O$ gas, and $O_3$ gas, or plasma of an oxygen-containing gas that is at least one gas selected from the group consisting of $O_2$ gas, $CO_2$ gas, NO gas, $N_2O$ gas, and $H_2O$ gas.

5. The method according to claim 1, wherein the film formation process alternately performs supplying the Si source gas into the process container, and supplying the oxidizing agent into the process container, with removing residual gas from inside the process container interposed therebetween.

6. The method according to claim 1, wherein the oxidation purge process uses an oxidizing agent the same as the oxidizing agent used in the film formation process.

7. The method according to claim 5, wherein the oxidation purge process comprises supplying an oxidizing agent in the same way as supplying the oxidizing agent in the film formation process.

8. The method according to claim 1, wherein the oxidation purge process uses an oxidizing agent for performing the oxidation, and the oxidizing agent used in the oxidation purge process is an oxygen-containing gas or plasma of an oxygen-containing gas.

9. The method according to claim 1, wherein the oxidation purge process uses an oxidizing agent for performing the oxidation, and the oxidizing agent used in the oxidation purge process is an oxygen-containing gas that is at least one gas selected from the group consisting of $O_2$ gas, $CO_2$ gas, NO gas, $N_2O$ gas, $H_2O$ gas, and $O_3$ gas, or a plasma of an oxygen-containing gas that is at least one gas selected from the group consisting of $O_2$ gas, $CO_2$ gas, NO gas, $N_2O$ gas, and $H_2O$ gas.

10. The method according to claim 1, wherein the Si source gas is diisopropylamino silane (DIPAS) gas, and each of the film formation process and the oxidation purge process is performed by use of a process temperature inside the process container set at room temperature, and comprises supplying an oxygen-containing gas activated by plasma onto the target object while exhausting gas from inside the process container.

11. The method according to claim 1, wherein the process container is configured to accommodate a holding member that supports a plurality of target objects at intervals in vertical direction, and the oxidation purge process is performed in parallel with an operation of preparing a batch of target objects, on which the film formation process is subsequently performed, on the holding member outside the process container.

12. The method according to claim 1, wherein the method further comprises a cleaning process for removing by-product films deposited inside the process container, performed after a cumulative film thickness of the $SiO_2$ film formed by the film formation process reaches a predetermined value of 2 to 5 μm and before the film formation process is subsequently performed, and the cleaning process comprises supplying a fluorine-containing gas into the process container while exhausting gas from inside the process container to etch the by-product films.

13. A method for using a film formation apparatus, which includes a vertical process container configured to hold a vacuum state therein,
a holding member configured to support a plurality of target objects at intervals in vertical direction inside the process container,
a source gas supply system configured to supply diisopropylamino silane (DIPAS) gas as an Si source gas into the process container,
an oxygen-containing gas supply system configured to supply an oxygen-containing gas into the process container,
a plasma generation mechanism disposed on the process container and configured to turn the oxygen-containing gas into plasma, and
an exhausting system configured to exhaust gas from inside the process container,
the method comprising a film formation process for forming a silicon oxide film on one batch of product target objects, and an oxidation purge process for performing oxidation on by-product films deposited inside the process container in a state where no product target objects present inside the process container, wherein the film formation process and the oxidation purge process are alternately repeated a plurality of times without, interposed therebetween, a process for removing the by-product films deposited inside the process container,
the film formation process being performed by use of a film formation process temperature inside the process container set at room temperature, and comprising:
supplying the DIPAS gas from the source gas supply system into the process container while exhausting gas from inside the process container by the exhausting system; and
supplying the oxygen-containing gas from the oxygen-containing gas supply system into the process container while exhausting gas from inside the process container by the exhausting system, wherein said supplying the oxygen-containing gas includes turning the oxygen-containing gas into plasma by the plasma generation mechanism to generate radicals from the oxygen-containing gas and to oxidize, by the radicals, substances derived from the DIPAS gas to form the silicon oxide film, and
the oxidation purge process being performed by use of an oxidation purge process temperature inside the process container set at room temperature, and comprising:
supplying the oxygen-containing gas from the oxygen-containing gas supply system into the process container, without supplying the DIPAS gas from the source gas supply system into the process container, while exhausting gas from inside the process container by the exhausting system, wherein said supplying the oxygen-containing gas includes turning the oxygen-containing gas into plasma by the plasma generation mechanism to generate radicals from the oxygen-containing gas and to perform oxidation on the by-product films by the radicals.

14. The method according to claim 13, wherein the method further comprises a cleaning process for removing by-product films deposited inside the process container, performed after a cumulative film thickness of the silicon oxide film formed by the film formation process reaches a predetermined value of 2 to 5 μm and before the film formation process is subsequently performed, and the cleaning process is performed by use of a process temperature inside the process container set at room temperature and comprises supplying HF gas into the process container while exhausting gas from inside the process container to etch the by-product films.

15. The method according to claim 14, wherein the cleaning process sets a pressure inside the process container to be 13.3 to 101,325 Pa.

16. The method according to claim 13, wherein the film formation process alternately repeats, a plurality of times, said supplying the DIPAS gas, and said supplying the oxygen-containing gas, with purging of the process container interposed therebetween, and said purging comprises exhausting gas from inside the process container without supplying either of the DIPAS gas and the oxygen-containing gas into the process container.

17. The method according to claim 16, wherein said supplying the DIPAS gas of the film formation process sets a pressure inside the process container to be 13.3 to 3,990 Pa, and said supplying the oxygen-containing gas of the film formation process uses $O_2$ gas as the oxygen-containing gas and sets a pressure inside the process container to be 13.3 to 1,333 Pa.

18. The method according to claim 13, wherein said supplying the oxygen-containing gas of the oxidation purge process sets a pressure inside the process container to be 13.3 to 1,333 Pa.

* * * * *